United States Patent [19]

Paine, Jr. et al.

[11] Patent Number: 5,188,757
[45] Date of Patent: Feb. 23, 1993

[54] PRECURSOR COMPOSITIONS FOR CONVERSION TO BORON NITRIDE

[75] Inventors: Robert T. Paine, Jr., Albuquerque, N. Mex.; Chaitanya K. Narula, Dearborn, Mich.; Riley O. Schaeffer, Los Alamos, N. Mex.

[73] Assignee: University of New Mexico, Albuquerque, N. Mex.

[21] Appl. No.: 598,372

[22] Filed: Oct. 15, 1990

Related U.S. Application Data

[62] Division of Ser. No. 312,881, Feb. 17, 1989, Pat. No. 4,971,779.

[51] Int. Cl.$^5$ .............................................. C09K 3/00
[52] U.S. Cl. ............................................... 252/183.11
[58] Field of Search ................................... 252/103.11

[56] References Cited

U.S. PATENT DOCUMENTS

| | | | |
|---|---|---|---|
| 3,288,726 | 11/1966 | Wagner et al. | 260/2 |
| 3,321,337 | 5/1967 | Patterson | 148/6.3 |
| 3,345,396 | 10/1967 | Horn et al. | 260/462 |
| 3,382,279 | 5/1968 | Horn et al. | 260/551 |
| 3,392,181 | 7/1968 | Horn | 260/448.2 |
| 3,578,403 | 5/1971 | Moore | 21/6 |
| 4,361,543 | 11/1982 | Zhdanovich et al. | 423/290 |
| 4,545,968 | 10/1985 | Hirano et al. | 423/290 |
| 4,550,151 | 10/1985 | Takamizawa et al. | 528/7 |
| 4,581,468 | 4/1986 | Paciorek et al. | 556/403 |
| 4,590,034 | 5/1986 | Hirano et al. | 419/14 |
| 4,655,893 | 4/1987 | Beale | 209/192.15 |
| 4,707,556 | 11/1987 | Paciorek et al. | 501/96 |
| 4,801,439 | 1/1989 | Blum et al. | 423/284 |
| 4,810,136 | 3/1989 | Johnson | 264/29.1 |
| 4,833,034 | 5/1989 | Maya | 428/408 |
| 4,931,100 | 6/1990 | Johnson | 106/163.1 |
| 4,971,779 | 11/1990 | Paine et al. | 423/290 |
| 4,987,201 | 1/1991 | Riccitiello et al. | 528/4 |
| 5,017,529 | 5/1991 | Blum et al. | 501/95 |
| 5,030,744 | 7/1991 | Funayama et al. | 556/402 |

FOREIGN PATENT DOCUMENTS 0015933  1/1985  Japan ................... 423/290

OTHER PUBLICATIONS

Narula et al., Mat. Res. Soc., Spring 1986 Meeting, Abstract Paper, "New Precursors to Boron-Nitrogen Macromolecules and Ceramics".
"Synthesis of Boron Nitride Ceramics from Poly(borazinylamine)Precursors" by Chaitanya K. Narula et al., Journal of the American Chemical Society, vol. 109, 5556 (1987).
"Boron Nitride and Its Precursors" K. J. L. Paciorek et al., American Chemical Society publication No. 0097-6156/88/0360-0392 (1988).
"Preparation and Characterization of Thin Protective Films in Silica Tubes by Thermal Decomposition of Hexachloroborazine" by G. Constant et al., Journal of the Less-Common Metals, vol. 82, pp. 113-118 (1981).
"Chemical Vapour Deposition of Thin Films of BN Onto Fused Silica and Sapphire" by M. Sano et al., Thin Solid Films, vol. 83, pp. 247-251 (1981).
"Chemical Vapor Deposition of Hexagonal Boron Nitride Thin Film on Iron" by T. Takahashi et al., Journal of Crystal Growth, vol. 47, pp. 245-250 (1979).
"Preparation and Properties of Thin Film Boron Nitride" by M. J. Rand et al., Journal Elect. Chem. Soc., vol. 115, p. 423 (1968).
"Boron Nitride Composites of Chemical Vapor Deposition" by H. O. Pierson; J. Composite Materials, vol. 9, p. 228 (Jul. 1975).
"Evaluation of Potential BN Polymer Precursors" by B. A. Bender et al., Ceram. Eng. Sci. Proc., vol. 6, pp. 1171-1183 (1986).
"Boron Nitrogen Polymers. I. Mechanistic Studies of Borazine Pyrolyses" by K. J. L. Paciorek et al., Journal of Polymer Science: Polymer Chem. Ed., vol. 24, pp. 173-185 (1985).
"Borazine Polymers. B-N Linked Borazine Rings and Polyborazylene Oxides" by Ross I. Wagner et al., Inorganic Chemistry, vol. 1, No. 1, pp. 99-106 (Feb. 1962).
"Preparation, Properties and Applications of Boron Nitride Thin Films" by S. P. S. Arya et al., Thin Solid Films, vol. 157, pp. 267-282 (1988).
"Inorganic Organometallic Polymers" by Martel Zeldin et al., American Chemical Society, Symposium Serial 360, pp. 378-384 (Jan. 7, 1988).
Abstract: "Boron Nitride Preceramic Polymers" by Paciorek et al., Textiles, vol. 105, No. 80546 (1986).
Abstract: "Study of Borazine Condensation Processes" by Paciorek et al., Organometallics, vol. 101, p. 641 (1984).
Abstract: "B-N Linked Borazines" by Ross I. Wagner, Synthetic High Polymers, vol. 66, p. 3685 (1967).
Abstract: "Boron-Nitrogen Polymers" by Paciorek et al.
Abstract: "Boron Nitride in Filament, Film or Other Forms" by Taniguchi et al., Industrial Inorganics, vol. 85, No. 96582 (1976).
Abstract: "Substituted Borazine Polymers as Precursors for Boron Nitride Ceramics" by Paciorek et al., Chemical Abstracts, vol. 108, p. 322 (1988).

(List continued on next page.)

Primary Examiner—Edward A. Miller
Attorney, Agent, or Firm—Deborah A. Peacock

[57] ABSTRACT

The disclosure is directed to polymeric B-aminoborazene compounds suitable for pyrolytic conversion to boron nitride. The B-aminoborazene compounds are preferably mixed with an organic solvent and a cross-linking agent to form a polymeric gel. The polymeric gel is then pyrolized to form boron nitride. The polymeric gel is useful to coat various forms and materials.

22 Claims, No Drawings

OTHER PUBLICATIONS

"Boron Nitride Preceramic Polymer Studies" by K. J. L. Paciorek et al., Ceram. Eng. Sci. Proc., vol. 9, pp. 993–1000 (1988).

"Boron–Nitrogen Polymers. 3. Nitrogen- and Oxygen-Bridged Compounds" by K. J. L. Paciorek et al., Inorg. Chem., vol. 27, pp. 2432–2436 (1988).

"Transformations of Organometallics into Common and Exotic Materials: Design and Activation" by Wynne, Ann. Rev. Mat. Sci., vol. 14, p. 314 (1984), further entitled: "Ceramics Via Polymer Pyrolysis: (1) General Principles and (2) the Crystal and Molecular Structure of Mu-imido-bis-[bis(trimethylsilyamino)] Borane".

"Boron Polymers" from 'Ceramics Via Polymer Pyrolysis' by K. J. Wynne, Ann. Rev. Mat. Sci., vol. 14, p. 314 (1984).

"About the Formation of Macrocyclic B–N Compounds" by A. Meller et al., Z. Naturforsch, vol. 33b, pp. 156–158 (1978).

AD-A158658 excerpt by K. J. L. Paciorek, pp. 1–2 (1986).

"Boron–Nitrogen Polymer Precursors, Synthesis, Structure and Stereochemistry of N-Boryl Derivatives of the 1,3,2-Diazaboracyclohexane Ring System" by S. Y. Shaw et al., Inorg. Chem., vol. 27, pp. 976–977 (1988).

Abstract: "Precursors to Boron Containing Solid State Materials" by C. K. Narula et al., First Boron USA Workshop, Apr. 10–13, 1988.

Abstract: "Inorganic Macromolecules Containing B–N Units" by C. K. Narula et al., 190th ACS National Meeting, Sep. 8–13, 1985.

Abstract: "Non-Oxide Ceramics: Precursors to B–N Materials" by C. K. Narula et al., 192nd ACS National Meeting, Sep. 7–12, 1986.

Abstract: "Synthesis of Boron-Nitride from Polyborazinyl Amines" by C. K. Narula et al., 193rd ACS National Meeting, Apr. 5–10, 1987.

PRECURSOR COMPOSITIONS FOR CONVERSION TO BORON NITRIDE

This is a division of application Ser. No. 07/312,881, filed Feb. 17, 1989, now U.S. Pat. No. 4,971,779.

BACKGROUND OF THE INVENTION

1. Cross-Reference to a Related Application

A related application entitled PRECURSORS FOR BORON NITRIDE COATINGS, U.S. Ser. No. 07/312,956, to Paine et al., filed Feb. 17, 1989 (now abandoned), the specification thereof is incorporated herein by reference.

2. Field of the Invention

This invention relates to monomer and polymer precursors useful for the formation of boron nitride articles and coatings.

3. Description of the Related Art

Non-oxide ceramic materials, such as borides, carbides and nitrides, in one or more crystalline modification, are known for their high mechanical strength, hardness, corrosion resistance, oxidation resistance and thermal shock stability. One commercially important example is provided by boron nitride, BN. Boron nitride has several crystalline modifications with the common hexagonal ($\alpha$) form being isostructural with graphite and the cubic ($\beta$) form being isostructural with diamond. Despite these structural similarities, boron nitride has much more favorable physical and chemical properties in comparison to carbon. For example, boron nitride has a high melting point (3000° C.), high anisotropic thermal conductivity, excellent dielectric properties, low chemical reactivity and high temperature semiconductor characteristics. Applications for hexagonal boron nitride include crucibles for metal evaporation, transistor heat sinks, nuclear reactor control rods, high temperature (800° C.) solid lubricants, metal corrosion resistant coatings and ceramic fiber coatings.

Boron nitride has been typically prepared in the prior art by high temperature pryolysis (900°–1200° C.) of simple boron and nitrogen containing materials, e.g. $B(OH)_3$ and urea. More recently, boron nitride has also been prepared by chemical vapor deposition (CVD) of mixtures of $BCl_3$, $BF_3$, or $B_2H_6$ with $NH_3$. In each case, the $\alpha$-form of boron nitride is normally obtained, and it is most often produced as a powder. Increasing demands for fibers, films, foams, etc., require new approaches to obtain $\alpha$- and $\beta$-boron nitride.

There is currently a large effort underway in the United States and abroad in the utilization of polymer pyrolysis as a route to solid state materials. This concept, coupled with sol-gel and aerogel processing techniques, which were developed for silica glass processing, has allowed for the generation of new forms of well known solid state materials, as well as new families of materials. In particular, new oxide glasses, carbide fibers, silicon nitride and boron carbide have been obtained from pyrolysis of appropriate polymers. However, very little effort has been devoted to preparing boron nitride by polymer precursor techniques since very few characterized polymers containing boron and nitrogen have been reported. A brief outline of some pertinent work which is in published literature and/or in patents is provided below.

Several efforts were made to prepare polymeric boron-nitrogen containing compounds in the early 1950s through 1960s. A good deal of the work that was published involved borazine and substituted borazine as the monomer species. Harris, *J. Org. Chem.*, 26, 2155 (1961), reported N-B coupling of two borazine, but no polymers were described. Laubengayer et al., *J. Am. Chem. Soc.* 83, 1337 (1961), reported on the thermal decomposition of the parent borazine $H_3B_3N_3H_3$. It was suggested that polymeric intermediates were formed, but they were not characterized. Wagner, et al., in "Synthetic High Polymers," *Chemical Abstracts*, 37349W, Vol. 66, p. 3685 (1967); "Borazine Polymers. B-N Linked Borazine Rings and Polyborazylene Oxides," *Inorganic Chemistry*, Vol. 1, pp. 99–106 (1962), and U.S. Pat. No. 3,288,726, entitled B-N LINKED BORAZENE DERIVATIVES AND THEIR PREPARATION, described the pyrolytic dehydrogenation of substituted borazine and resultant formation of N-B coupled borazine where the coupling chemistry directly linked B and N atoms in two rings. Wagner also described coupling of two borazine rings via an exo oxygen atom giving a B—O—B bridge. In the first case, it was proposed that ten rings could be coupled while, in the latter case, it was suggested that two to 23 rings could be coupled. In the '726 patent, a good deal of cross-linking chemistry involving substituted borazine was described. Horn, et al., in U.S. Pat. Nos. 3,345,396, entitled ORGANO-SUBSTITUTED BORAZINES; No. 3,392,181, entitled CYCLIC BN-COMPOUNDS; and No. 3,382,279, entitled PROCESS FOR THE PRODUCTION OF SILICON-CONTAINING N;N':N"-TRIORGANO-B:B':B"-TRIHYDRIDO-BORAZOLES; reported more complex polymerization chemistry involving large organic coupling agents. A. Meller, in *Monatsh. Chem.* 99, 1670 (1968), reported reactions of amino substituted borazine with diborane, which led to cleavage of the amino group on the borazine. No mention was made of the use of the polymers described in these reports for boron nitride precursors and no extensive high temperature pyrolysis chemistry was examined.

Patterson, in U.S. Pat. No. 3,321,337, entitled PROCESS FOR PREPARING BORON NITRIDE COATINGS, described an ambient pressure chemical vapor deposition process for $\alpha$-boron nitride deposition on metals using B-trichloro borazine, $Cl_3B_3N_3H_3$.

Taniguchi, in Japan Kokai 76 53,000 (Chem. Abstr. 85, 96582v (1976), reported the formation of filaments and films of boron nitride by extrusion and pyrolysis of a polymer obtained by heating $(H_2NBNC_6H_5)_3$. No further details of the formation, characterization and processing of the polymer have appeared.

In 1978, Meller, et al., in *Z. Naturforsch*, 88b, 156–158, reported reactions of B-2-alkyl,-4,6-dichloro,N-1,3,5 trimethylborazines with hexamethyl disilizane, which produced polymers which were only partially characterized. Pyrolysis chemistry of the polymers was not described.

In 1984, Paciorek, et al., in *Polym. Prepr. (Am. Chem. Soc., Div. Polym. Chem.)* 25(1), 15 (1984) (Abstr.), reported condensation reactions of several substituted borazine. All of this chemistry presumably involved direct ring-ring coupling (B-N bonds). Subsequently, the same group, Paciorek, et al., in *Chemical Abstracts*, 104, 211725v. (Abstr.); U.S. Pat. No. 4,581,468, entitled BORON NITRIDE PRECERAMIC POLYMERS; and "Boron-Nitrogen Polymers. I. Mechanistic Studies of Borazine Pyrolyses," *Journal of Polymer Science*, Vol. 24, pp. 173–185 (1986); discussed the use of these polymers as preceramic polymers, and they described some limited pyrolysis chemistry. They claimed that boron rich boron nitrides were obtained as black solids.

Bender, et al., in Cerm. Eng. Sci. Proc. 6, 1171 (1985), in collaboration with Paciorek, examined further details of the pyrolytic chemistry of substituted borazine including the monomer $(H_2NBNC_6H_5)_3$ utilized by Taniguchi. In contrast to Taniguchi, they observed the formation of amorphous non-stoichiometric (boron-rich) materials from this precursor. Other borazine offered some promise for production of boron nitride fibers.

Numerous references to the conversion of α-boron nitride to β-boron nitride have appeared and the vast majority depend upon the high temperature-high pressure recrystallization of a α-boron nitride prepared from classical thermal routes, e.g., pyrolysis of boric acid and urea. (See Moore, U.S. Pat. No. 3,578,403, entitled RECRYSTALIZATION OF PYROLYTIC BORON NITRIDE, to Zhdanovich, and U.S. Pat. No. 4,361,543, entitled PROCESS FOR PRODUCING POLYCRYSTALS OR CUBIC BORON NITRIDE, to Zhdanovich, et al.). In a different approach, Beale, in U.S. Pat. No. 4,655,893, entitled CUBIC BORON NITRIDE PREPARATION UTILIZING A BORON AND NITROGEN BEARING GAS, reported formation of β-boron nitride by activated reactive evaporation of borazine $(HNBH)_3$ and a metal (Cr, Ni, Co, Al, Mu) catalyst.

In 1985, Hirano, et al., in U.S. Pat. No. 4,545,968, entitled METHODS FOR PREPARING CUBIC BORON NITRIDE SINTERED BODY AND CUBIC BORON NITRIDE, AND METHOD FOR PREPARING BORON NITRIDE FOR USE IN THE SAME, and U.S. Pat. No. 4,590,034, entitled METHOD FOR PREPARING SINTERED BODY CONTAINING CUBIC BORON NITRIDE AND METHOD FOR PREPARING CUBIC BORON NITRIDE, described very generalized high temperature—high pressure routes to β-boron nitride involving borazine and substituted borazine.

Specific polymeric boron-nitrogen compounds have been recently developed as pyrolysis precursors to boron nitride. One such process uses the borazine, $Cl_3B_3N_3H_3$, as the primary monomer as follows:

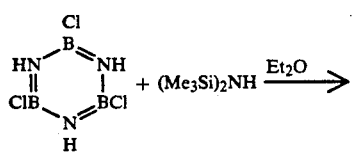

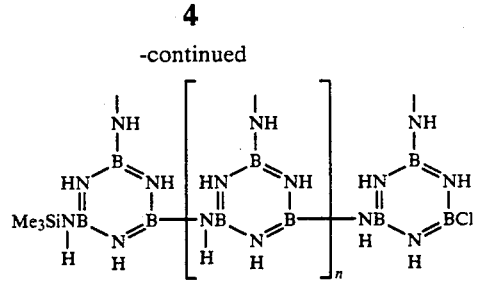

wherein $Et_2O$ represents diethyl ether, and n represents an integer. This polymer is then pyrolized to produce solid powder α-boron nitride, as follows:

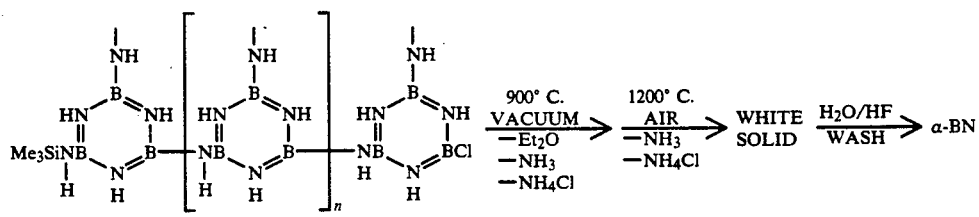

This powder cannot be successfully used for a coating requiring liquid properties. Prior art publications describing this work include: Narula, et al., "Synthesis of Boron Nitride Ceramics From Poly(borazinylamine) Precursors," *Journal of American Chemical Society,* (1987); "Precursors to Boron-Nitrogen Macromolecules and Ceramics," *Mat. Res. Soc. Symp. Proc.* Vol. 73, p. 383 (1986); and "New Precursors to Boron-Nitrogen Macromolecules and Ceramics," *Abstr.* H6.4 Mat. Res. Soc. Meeting, Spring 1986.

Paine, et al., in U.S. Pat. application U.S. Ser. No. 07/312,956, entitled PRECURSORS FOR BORON NITRIDE COATINGS filed Feb. 17, 1989 (now abandoned) describes the application of boron nitride coatings on various articles.

SUMMARY OF THE INVENTION

In accordance with the present invention there is provided a composition and method using such composition for pyrolytic conversion of the composition to boron nitride. The composition comprises a borazine compound having a general formula selected from the compounds consisting of $(ClB)_2(BNR_2)(NH)_3$, $(ClB)_2[BN(H)R](NH)_3$, or $(ClB)_2[BN(SiR_3)_2](NH)_3$, wherein R may comprise an alkyl group or an aryl group. The borazine compound may comprise a monalkylamido, dialkylamido, monoarylamido, diarylamido, or distilylamido group. The R alkyl groups preferably comprise methyl, ethyl, n-propyl, iso-propyl, iso-butyl, n-butyl, t-butyl, n-pentyl, or cyclo-hexyl, and the R aryl groups preferably comprise phenyl, tolyl, or mesityl.

The composition preferably comprises a solvent, which may be an organic solvent comprised of the group consisting of chlorocarbons, ethers, organoacetates, arenes, and hydrocarbons. The composition may further comprise at least one cross-linking agent, which is preferably a silylamine compound of the general formula $[(CH_3)_3Si]_2NR$, wherein R represents hydrogen or methyl. The silylamine compound preferably comprises hexamethyldisilizane, $[(CH_3)_3Si]_2NH$ or heptamethyldisiliane, $[(CH_3)_3Si]_2N(CH_3)$, in an approximately equimolar amount to the borazine compound. The composition of the preferred embodiment may further comprise a dopant.

One preferred borazine compound is 2-B-dimethylamino-4,6-B-dichloroborazine. This compound ay be treated with borane(3) tetrahydrofuran complex for cleaving amino groups from the borazine compound and replacing them with hydrogen.

The invention further comprises a process for the pyrolytic conversion of a polymeric precursor composition to boron nitride comprising the steps of:

(a) obtaining a borazine compound, as set forth above;

(b) dissolving the borazine compound in a solvent in the presence of a cross-linking agent to form a polymeric gel; and (c) converting the polymeric gel to boron nitride by pyrolysis. Solvents and cross-linking agents, useful in accordance with the invention, are discussed above.

In the preferred embodiment, the polymeric gel is preferably heated at approximately the solvent reflux temperature and the solvent is substantially removed prior to step (c). The solvent is substantially removed by a method such as decantation, vacuum evaporation, sol-gel techniques, or aerogel techniques.

The polymeric gel is pyrolyzed in step (c) at a sufficient temperature and pressure for a sufficient time to obtain boron nitride. The pyrolysis temperature is preferably between approximately 300° C. and 900° C. to obtain amorphous boron nitride. The amorphous boron nitride may be further pyrolyzed at a higher temperature to obtain crystalline hexagonal boron nitride, or the polymeric gel may be directly converted to crystalline hexagonal boron nitride. A temperature of at least 1200° C. is preferred to obtain crystalline hexagonal boron nitride. The polymeric gel or the amorphous or hexagonal boron nitride may be pyrolyzed, preferably in the presence of a catalyst added to the reaction mixture, to obtain crystalline cubic boron nitride. Dopants may be added to the polymeric gel.

The polymeric gel can be applied as a liquid coating on materials such as oxides, non-oxides, and/or glasses, and on forms such as substrates, powders, fibers, crystals, and preformed parts. If desired, the resulting boron nitride product may be free of carbon impurities.

It is a primary object of the present invention to provide boron nitride precursor compositions which are useful for forming boron nitride products and articles coated with boron nitride.

It is another object of the present invention to provide processes for making boron nitride precursor compositions, which are easy and inexpensive.

Yet another object of the present invention is to provide coating compositions which are easy to apply to articles and convert to boron nitride.

Other objects, advantages and novel features, and further scope of applicability of the present invention will be set forth in part in the detailed description to follow, and in part will become apparent to those skilled in the art upon examination of the following, or may be learned by practice of the invention. The objects and advantages of the invention may be realized and attained by means of the instrumentalities and combinations particularly pointed out in the appended claims.

DETAILED DESCRIPTION OF THE PREFERRED EMBODIMENTS OF THE INVENTION

The present invention provides several compositions and methods for producing boron nitride, and includes boron nitride products, substrates, and articles coated with these compositions which convert to boron nitride. The invention is useful in the production of amorphous (non-crystalline) boron nitride, crystalline alpha (also designated as hexagonal and $\alpha$) boron nitride, and crystalline beta (also designated as cubic and $\beta$) boron nitride.

The borazine monomer $(HNBCl)_3$, has three identical reaction sites suitable for borazine ring cross-linking reactions which would result in B-N-B bridges, namely the three B-Cl bonds as shown.

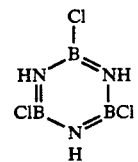

In the present invention, one of the chlorine substituents in the borazine monomer is replaced by at least one dialkylamido or diarylamido group, represented by the formula $NR_2$; or monoalkylamido or monoarylamido group, represented by the formula $(N)(H)(R)$; or disilylamido group, represented by the formula $(N)(R_3Si)_2$. Alkyl groups, R, particularly useful for the dialkylamido and monoalkylamido groups of the invention, include but are not limited to the following: methyl (Me), $CH_3$; ethyl (Et), $C_2H_5$; n-propyl (n-Pr), n-$C_3H_7$; iso-propyl (i-Pr), i-$C_3H_7$; iso-butyl (i-Bu), i-$C_4H_9$; n-butyl (n-Bu), n-$C_4H_9$; t-butyl (t-Bu), t-$C_4H_9$; n-pentyl, n-$C_5H_{11}$; and cyclo-hexyl, c-$C_6H_{11}$. Aryl groups, R, particularly useful for the diarylamido and monoarylamido groups of the invention, include but are not limited to the following: phenyl (Ph), $C_6H_5$; tolyl, $(CH_3)C_6H_4$; and mesityl, $(CH_3)_2C_6H_3$. Alkyl and aryl groups, R, useful in the disilylamido groups of the invention, include but are not limited to methyl, ethyl, and phenyl.

The resulting borazine compounds are represented by the following general formulas:

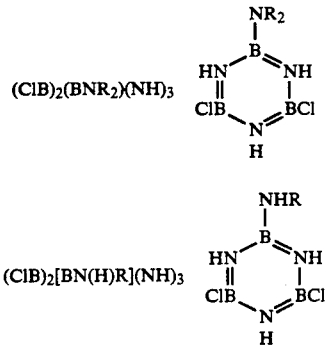

-continued (ClB)₂[BN(SiR₃)₂](NH)₃ 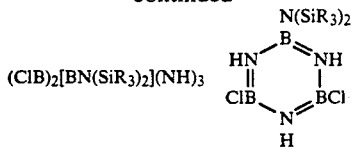

wherein R is an alkyl or aryl group, as discussed above.

The borazine compounds are cross-linked to form a preceramic polymer, which when pyrolized, yields boron nitride. The amino substituent group on one boron atom serves to limit cross-linking reactions to the remaining two B-Cl functional groups and the products are linear polymers. As used throughout the specification and claims, the term "polymer" is also intended to include "oligomer" and means a plurality of monomer units.

One preferred cross-linking agent, useful in accordance with the invention for cross-linking with the borazine compounds of the invention, comprises a silylamine, having the general formula [R'₃Si]₂NR", wherein R' represents methyl, ethyl, and phenyl, and R" represents an alkyl or aryl group, such as discussed above. The Preferred silylamines are hexamethyldisilizane, [(CH₃)₃Si]₂NH, and heptamethyldisilizane, [(CH₃)₃Si]₂N(CH₃). These cross-linking agents are combined with the borazine compounds, preferably in an equimolar amount with the borazine compounds, and preferably in the presence of an organic solvent. Preferred organic solvents, useful in accordance with the invention, include but are not limited to chlorocarbons, ethers, organo acetates, arenes, and hydrocarbons, for example, chlorobenzene, chloroform, methylene chloride, diethyl ether, tetrahydrofuran, ethyl acetate, amyl acetate, benzene, toluene, and hexane.

In one preferred method of the invention, the borazine compounds, such as 2-B-dimethylamino-4,6-B-dichloro borazine, are dissolved in an organic solvent, such as diethyl ether (Et₂O), and a cross-linking agent, such as hexamethyldisilizane, is added to the solution preferably in an approximate equimolar amount with the borazine as follows:

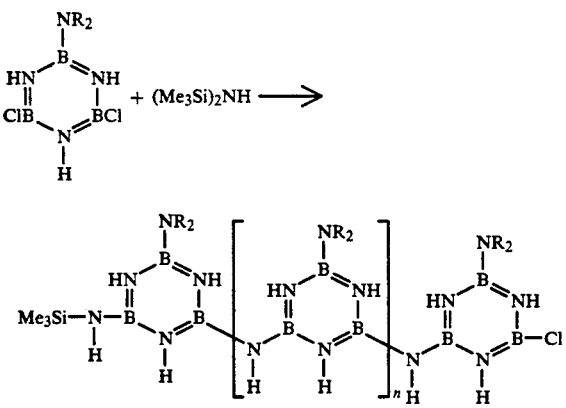

The resulting solution is preferably heated to reflux the solvent and the reflux is continued for a sufficient time (e.g., at least four hours) to ensure complete condensation of the borazine monomer with the cross-linking agent. This results in the formation of borazine gels. When the solvent and the borazine gels are heated at the reflux temperature (approximately the boiling point of the solvent), the gelation rate and the chain growth accelerates, and a more dense gel, i.e., the "n" number is larger, is obtained. The resulting borazine gel products are useful as polymeric precursors for pyrolytic conversion to boron nitride. The gelation rate depends upon (and is controlled by modification of) the R (alkyl or aryl) group on the borazine substituent groups on the cross-linking agent, the solvent, and the temperature. As can be appreciated by those skilled in the art, the above formula is intended to include al borazine compounds of the invention, as set forth above, and is not limited to the particular compound shown immediately above in the formula. Likewise, the resulting gel in accordance with the invention are not limited to the resulting gel compound shown immediately above. These gels will differ depending on the starting borazene-compounds and the varying processing contemplated by this invention.

The polymeric precursor gels can be further processed to substantially remove the solvent by utilizing decantation, vacuum evaporation, sol-gel and aerogel (critical-point drying) techniques, common to the art, for processing other types of gels. The sol-gel and aerogel techniques have been used extensively for the formation of coatings and films in glass (SiO₂) technology, but they have not been used extensively in the art for non-oxide ceramic processing. Sol-gel processing can be accomplished with the borazine compounds of the invention, cross-linking groups, and most organic solvents. The gels can take the form of their containers. In aerogel techniques, the gels may be extracted with liquid CO₂ under critical point conditions.

The gels may be pyrolyzed at a sufficient temperature and pressure for a sufficient time to obtain boron nitride. Complete pyrolysis occurs preferably in a temperature range of between approximately 300° C. to 900° C. for between approximately thirty minutes to twelve hours. The pyrolysis is preferably performed under flowing nitrogen gas and with continuous removal of substantially all volatile products (e.g., (Me₃SiCl)) in vacuo, such as by vacuum evaporation with the resulting formation of amorphous boron nitride. The gels may be additionally pyrolyzed at higher temperatures of approximately 1200° C. or higher for between approximately thirty minutes to twelve hours, preferably under inert or non-reactive gases, such as nitrogen and argon, or reactive gases, such as air and ammonia, with the resulting formation of crystalline α-boron nitride (or β-boron nitride, discussed below). The resulting boron nitride material may be contaminated with small amounts of carbon, for instance if the pyrolysis is accomplished in air.

In an alternative process to prevent any carbon from being present in the resulting boron nitride products of the invention, the carbon originating from alkyl and aryl groups or amine nitrogen atoms can be removed early in the chemical process (prior to extensive solvent reflux) by treatment of the polymeric starting gel solution with, for example, a borane(3) tetrahydrofuran complex, e.g. H₃B.OC₄H₈. This serves to cleave the amino groups discussed above (and represented generally by NR₂ in the following formula) and replace them with hydrogen substituents, as shown by the following:

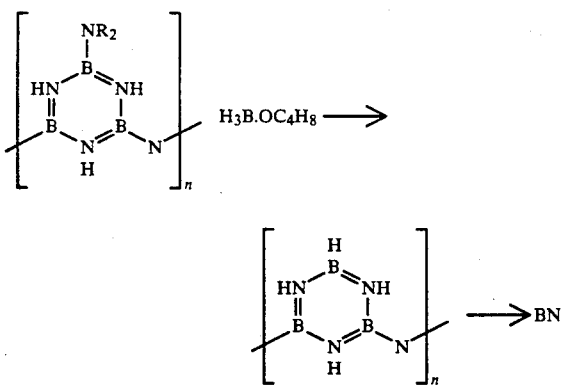

As can be appreciated by those skilled in the art, the NR$_2$ group shown in the above formula can also be replaced by NRH, and N(SiR$_3$)$_2$. Pyrolysis results in a boron nitride ceramic product completely free of carbon impurities. In addition, pyrolysis gives a very high ceramic yield. The pyrolysis preferably occurs at 300° C. to 900° C., where amorphous boron nitride is formed. Further heating at 1200° C. or higher produces crystalline α-boron nitride. Conversion to β-boron nitride may be accomplished as discussed below.

If carbon is desired in the resulting boron nitride product, the carbon can be included or added to the borazine monomer gel precursor, such as by alkyl or aryl group substitution on the borazine ring nitrogen atoms. Alternatively, the composition and process of the invention allows for the production of carbon free boron nitride, such as discussed above.

The boron nitride obtained in the procedure described above may be converted to cubic boron nitride by any of the standard high temperature/high pressure methodologies known in the art. Catalysts are typically mechanically mixed with boron nitride in the art to convert it to cubic boron nitride. One advantage of the present invention is that catalysts may be introduced homogeneously to the gels. This in turn results in homogenous inclusion of the catalyst in the boron nitride matrices, which may provide lower α-boron nitride to β-boron nitride transformation conditions.

Dopants, such as phosphorus, sulfur, silicon, and other main group and transition metal elements, may be incorporated in the starting solution by introducing the dopant elements in the borazine ring or in the cross-linking agent and these are retained, in some cases, in the final ceramic product in a highly dispersed state. Dopants modify the properties of the boron nitride in specific ways.

The gels may be used to coat metal oxides or inorganic oxides, for example, alumina (Al$_2$O$_3$), zirconia (ZrO$_2$), and magnesia (MgO), other oxides, and non-oxides, in any forms or substrates, including single crystals, powders, and preformed parts, and fibers. The gels are dispersed on the oxide and non-oxide forms and then heated. When the gels on the forms are heated to approximately 1200° C. or higher, a thin coating (10 Å to 1000 Å or more) of highly crystalline α-boron nitride forms on the oxide or non-oxide. This coating provides a protective coating on the oxide form or substrate.

One advantage of using the foregoing compositions and methods of the invention, as compared to prior art processes, is that the gels have liquid properties which allow them to be applied as films or coatings on oxide, non-oxide, glass and metal substrates, as well as other forms. This compares to the prior art in which vapor deposition processes are used; such processes are limited in application by the few useful gas phase reagents available. In addition, the high temperature stability of films produced by vapor deposition techniques is less than the stability of the coatings produced by this method. Articles requiring a boron nitride coating can be coated, in accordance with the invention.

The invention is further illustrated by the following non-limiting examples.

EXAMPLE I

In the first stage, 9.9 g of 2,4,6-B-borazine was dissolved under dry non-reactive gas in diethyl ether (200 ml) and dimethylamine (4.86 g) was condensed into the reaction mixture at −78° C. After complete addition, the reaction mixture was stirred and warmed to 25° C. The resulting mixture was stirred for 8–12 hours and then filtered. The residue from the filtration (predominantly Me$_2$NH$_2$Cl) was washed twice with diethyl ether and the combined ether filtrates were evaporated to dryness. The resulting residue was dissolved in hexane (200 ml) and filtered to remove any Me$_2$NH$_2$Cl carried through by the ether. The hexane filtrate was vacuum evaporated and the remaining product (Me$_2$NB)(BCl)$_2$(NH)$_3$ was purified by sublimation. The yield was 9.1 g (87%).

In the second stage, the resulting product, 2-B-dimethylamino-4,6-B-dichloroborazine (6.9 g) was dissolved in chlorobenzene (approximately 50 ml) and hexamethyldisilizane (5.76 g) was added with stirring. After complete addition the stirring was stopped, and a colorless gel formed. The reaction mixture was then heated at chlorobenzene reflux (boiling point) for approximately 5–6 hours to form a denser gel.

Samples of the preceramic borazinyl polymer obtained by sol-gel techniques and by CO$_2$ extraction (aerogel conditions) were pyrolyzed in vacuo between 600° C. and 900° C. for 12 hours. The resulting ceramic products contained carbon and were amorphous. Subsequent heating to 1200° C. for two hours in air produced a grey α-boran nitride sample contaminated with small amounts of carbon. Alternatively, the ceramic product was pyrolyzed under NH$_3$ for 12 hours and the final product was free of carbon impurities.

EXAMPLE II

A boroazinyl gel sample was obtained by combining 2-B-dimethylamino-4,6-B-dichloroborazine (7.8 g) and hexamethyldisilizane (6.86 g) in 200 ml diethyl ether. The remaining liquid after gelation was drained from the reaction vessel, and the gel was then exposed to fresh diethyl ether (approximately 150 ml). To this mixture was added H$_3$B.OC$_4$H$_8$ (85 ml), 1M solution in hexane). The mixture was allowed to stand for twenty-four hours and then the liquid covering the gel was removed. $^{11}$B NMR analysis of the liquid showed the presence of no H$_3$B.OC$_4$H$_8$, but formation of Me$_2$NB$_2$H$_5$ and Me$_2$N(H)BH$_3$.

The remaining gel was dried in vacuo and pyrolyzed in vacuo between 600° C. and 900° C., leaving amorphous white boron nitride. Treatment of this solid for 12 hours at 1200° C. in N$_2$, air or NH$_3$, resulted in crystalline α-boron nitride, free of carbon.

Although the invention has been described with reference to these preferred embodiments, other embodiments can achieve the same results. Variations and modifications of the present invention will be obvious to those skilled in the art and it is intended to cover in the appended claims all such modifications and equivalents.

What is claimed is:

1. A composition suitable for pyrolytic conversion to boron nitride, the composition comprising:
a B-aminoborazine compound having a general formula selected from the group consisting of $(ClB)_2(BNR_2)(NH)_3$, $(ClB)_2[BN(H)R](NH)_3$ and $(ClB)_2[BN(SiR_3)_2](NH)_3$, and wherein each R is a member selected from the group consisting of alkyl groups and aryl groups;
a solvent; and
a cross-linking agent.

2. The composition of claim 1 wherein the B-aminoborazine compound has the general formula $(ClB)_2(BNR_2)(NH)_3$, and where $NR_2$ is dialkylamido.

3. The composition of claim 2 wherein each R is a member selected from the group consisting of methyl, ethyl, n-propyl, iso-propyl, iso-butyl, n-butyl, t-butyl, n-pentyl, and cyclo-hexyl.

4. The composition of claim 1 wherein the B-aminoborazine compound has the general formula $(ClB)_2[BN(H)R](NH)_3$, and wherein N(H)R is monoalkylamido.

5. The composition of claim 4 wherein each R is a member selected from the group consisting of methyl, ethyl, n-propyl, iso-propyl, iso-butyl, n-butyl, t-butyl, n-pentyl, and cyclo-hexyl.

6. The composition of claim 1 wherein the B-aminoborazine compound has the general formula $(ClB)_2(BNR_2)(NH)_3$, and wherein $NR_2$ is diarylamido.

7. The composition of claim 6 wherein each R is a member selected from the group consisting of phenyl, tolyl, and mesityl.

8. The composition of claim 1 wherein the B-aminoborazine compound has the general formula $(ClB)_2[BN(H)R](NH)_3$, and where N(H)R is monoarylamido.

9. The composition of claim 8 wherein R is a member selected from the group consisting of phenyl, tolyl, and mesityl.

10. The composition of claim 1 wherein the B-aminoborazine compound has the general formula $(ClB)_2[BN(SiR_3)_2](NH)_3$, and where $N(SiR_3)_2$ is disilylamido.

11. The composition of claim 10 wherein each R is a member selected from the group consisting of methyl, ethyl, and phenyl.

12. The composition of claim 1 wherein the solvent comprises an organic solvent.

13. The composition of claim 12 wherein the organic solvent comprises at least one member selected from the group consisting of chlorocarbons, ethers, organoacetates, arenes, and hydrocarbons.

14. The composition of claim 1 wherein the cross-linking agent comprises a silylamine compound.

15. The composition of claim 14 wherein the silylamine compound has the general formula $[(CH_3)_3Si]_2NR$, and wherein R is a member selected from the group consisting of hydrogen and methyl.

16. The composition of claim 15 wherein the silylamine compound is hexamethyldisilizane, $[(CH_3)_3Si]_2NH$.

17. The composition of claim 15 wherein the silylamine compound is heptamethyldisilizane, $[(CH_3)_3Si]_2N(CH_3)$.

18. The composition of claim 14 wherein the silylamine compound is in an approximately equimolar amount to the B-aminoborzine compound.

19. The composition of claim 1 wherein the B-aminoborazine compound is 2-B-dimethylamino-4,6-B-dichloroborazine.

20. The composition of claim 1 further comprising at least one reagent for cleaving amino groups form the B-aminoborazine compound and replacing them with hydrogen.

21. The composition of claim 20 wherein the reagent is a borane(3) tetrahydrofuran complex.

22. The composition of claim 1 wherein the compound further comprises a dopant.

* * * * *